US007495457B2

(12) United States Patent
Danbata (10) Patent No.: US 7,495,457 B2
(45) Date of Patent: Feb. 24, 2009

(54) SEMICONDUCTOR DEVICE EVALUATION METHOD AND APPARATUS USING THE SAME (75) Inventor: Masayoshi Danbata, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 12/042,195

(22) Filed: Mar. 4, 2008

(65) Prior Publication Data
US 2008/0218193 A1 Sep. 11, 2008

(30) Foreign Application Priority Data
Mar. 6, 2007 (JP) ............................. 2007-055755

(51) Int. Cl.
*G01R 31/305* (2006.01)
(52) U.S. Cl. ....................................... 324/751; 324/501
(58) Field of Classification Search ................. 324/751, 324/501
See application file for complete search history.

(56) References Cited

U.S. PATENT DOCUMENTS

| 6,160,407 | A  | * | 12/2000 | Nikawa ........................ 324/750 |
| 6,344,750 | B1 | * | 2/2002  | Lo et al. ...................... 324/751 |
| 6,839,646 | B2 | * | 1/2005  | Ishii ............................ 702/117 |
| 7,179,553 | B2 | * | 2/2007  | Murphy et al. ................ 429/12 |

2004/0239347 A1* 12/2004 Yamada et al. .............. 324/751

FOREIGN PATENT DOCUMENTS

JP 2001-127125 A 5/2001

* cited by examiner

*Primary Examiner*—Ha Tran T Nguyen
*Assistant Examiner*—Richard Isla Rodas
(74) *Attorney, Agent, or Firm*—Sughrue Mion, PLLC (57) ABSTRACT

In order to provide a semiconductor device evaluation method and a semiconductor device evaluation apparatus for correctly detecting an error position and providing a substrate for observing a cross section without difficulties, a transport unit of a SEM apparatus moves a substrate on a stage. A detection unit detects electric information of observed objects including an error position arranged on the substrate. A calculating unit calculates integrals based on the electric information in at least first and second directions among directions in which arrays of the observed objects are arranged, detects a first waveform obtained by calculating the integral in the first direction and detects a second waveform obtained by calculating the integral in the second direction, wherein the first waveform includes a peak which contains the array of the observed objects including the error position and is larger than at least one of the other peaks, and wherein the second integral-waveform has peaks of substantially the same height. A control unit controls the transport unit so as to move the semiconductor substrate in a direction for maintaining the peak of the first waveform that includes the error position and controls the calculating unit to count the peaks of the second waveform.

6 Claims, 7 Drawing Sheets

SEMICONDUCTOR DEVICE EVALUATION METHOD AND APPARATUS USING THE SAME

BACKGROUND OF THE INVENTION

1. Field of the Invention

The present invention relates to a semiconductor device evaluation method and a semiconductor device evaluation apparatus for detecting a problematic or error portion of the semiconductor device and providing a substrate for observing a cross section of the semiconductor device.

Priority is claimed on Japanese Patent Application No. 2007-055755, filed Mar. 6, 2007, the content of which is incorporated herein by reference.

2. Description of Related Art

In recent years, semiconductor devices have been becoming very thin and have multiple layers. Therefore, there is a significant increase in the number of production step processes of semiconductor devices, and there is an increase of a ratio of physical problems of the semiconductor devices.

Among such physical problems, problems caused by foreign matter being present on a surface, the shape, and the like can be detected by applying an optical test. On the other hand, an electrical problem such as conduction problem of a contact plug arranged between or under layers can be detected by using a SEM (Scanning Electron Microscope) test apparatus using EB (electron beam). For example, if EB is radiated when multiple contact plugs are exposed, a contact plug which has a conduction problem with a conductive material arranged at a lower layer has electrification of electrons, and the contact plug has a lower contrast because of lower secondary electrons compared to other normal contact plugs. An error bit is detected by using such phenomena of a voltage contrast.

However, there is another problem in which it is not possible to process constitutional materials by using EB even if the SEM test apparatus can detect a position of the electrical problem. Therefore, it is not possible to physically detect details of the electrical problem, and it is not possible to detect phenomena that have caused the problem in the production process. Therefore, in order to analyze the cause of the problem, it is very important to detect a position of the electrical problem, to analyze a cross section of the semiconductor substrate after exposing a portion of the problem by processing and to detect the physical condition of the problem.

In order to solve such a problem, a solution has been proposed in which, after detecting the position of the electrical problem by the SEM test apparatus, the semiconductor substrate is moved and mounted on FIB (Focused Ion Beam) apparatus which can process constitutional materials, and a portion of the problem is processed. In such an operation of moving the semiconductor substrate, in order to prevent the position of the problem from being missed, a burn mark (burning by EB which uses electrification) is set in accordance with techniques disclosed in, for example, Patent Document 1. After moving and mounting the semiconductor substrate on the FIB apparatus, based on the burn mark, the bit position of the problem is recognized.

[Patent Document 1] Japanese Patent Application, First Publication No. 2001-127125

However, the above-described burn mark is an unstable mark which disappears in the case of a leakage of electricity. Therefore, if time has passed, it is difficult to detect the mark. That is, it is not an unusual case in which it is not possible to detect the burn mark after moving and mounting the semiconductor substrate on the FIB apparatus from the test apparatus. Therefore, in a practical case, in order to detect the position of the error bit, until a position of the problem is detected, it is necessary to repeat an operation in which a cross section is reviewed by using SEM while shaving or slicing a surface of the substrate by using the FIB apparatus. However, in accordance with such an operation, it takes long time for conducting FIB processes because the position of the error bit is not clear beforehand, and moreover, there is a possibility in which the problem of the error bit is removed or lost by shaving or slicing the FIB apparatus.

On the other hand, another solution has been proposed in which the position of the error bit is detected by counting a number of bits from a mat end, that is, from the position of a certain bit at the end of arrayed pattern of an observed object formed on the substrate.

However, in such a solution, there is a problem in which a number of bits is counted by an operator, and it takes an excess amount of time and labor.

SUMMARY OF THE INVENTION

The present invention has been conceived in order to solve the above-described problem, and has an objective to provide a semiconductor device evaluation method and a semiconductor device evaluation apparatus for correctly detecting an error position and providing a substrate for observing a cross section without difficulties.

The present invention was conceived in order to solve the above-described problems and has, for example, the following aspects.

A first aspect is a semiconductor device evaluation method of a semiconductor device evaluation apparatus for evaluating observed objects including an error position arranged on a semiconductor substrate, including steps of: a first step of detecting electric information of the observed object including the error; a second step of calculating integrals based on the electric information in at least first and second directions among directions in which arrays of the observed objects are arranged, detecting a first integral-waveform obtained by calculating the integral in the first direction and detecting a second waveform obtained by calculating the integral in the second direction, wherein the first waveform includes a first peak which contains the array of the observed objects including the error position and is larger than at least one of the other peaks, and wherein the second integral-waveform has peaks of substantially the same height; a third step of counting peaks of the second waveform caused while moving the semiconductor substrate in a direction for maintaining the peak of the first waveform that contains an array of the observed objects including the error position; and a fourth step of, while the semiconductor substrate is moved from the error position to a predetermined reference position in the third step, calculating the total number of the peaks regarding both vertical and lateral directions of the semiconductor substrate.

A second aspect is the above-described semiconductor device evaluation method, preferably further including: a fifth step of detecting the reference position on the semiconductor substrate; a sixth step of detecting electric information of the observed objects including the error position arranged on the semiconductor substrate; a seventh step of calculating integrals based on the electric information detected in the sixth step in at least third and fourth directions among directions in which arrays of the observed objects are arranged, detecting a third integral-waveform obtained by calculating the integral in the third direction and detecting a fourth waveform obtained by calculating the integral in the fourth direction, wherein the third waveform includes a third peak which contains an array of the observed objects including the error position and which is larger than at least one of the other peaks, and wherein the fourth integral-waveform has peaks of substantially the same height; an eighth step of counting peaks of the fourth waveform while moving the semiconductor substrate from the reference position in a direction for maintaining the peak of the third waveform containing an array of the observed objects including the error position; a ninth step of conducting a counting operation of the eighth step in both the vertical and lateral directions of the semiconductor substrate, moving the semiconductor substrate until the total number of peaks in the vertical direction detected in the eighth step reaches the total number of peaks in the vertical direction obtained in the fourth step and the total number of peaks in the lateral direction detected in the eighth step reaches the total number of peaks in the lateral direction obtained in the fourth step; and a tenth step of processing the semiconductor substrate after a moving operation of the ninth step by radiating a focused ion beam.

A third aspect is the above-described semiconductor device evaluation method, wherein, in the third step, when the semiconductor substrate is moved in a direction for maintaining the peak of the second waveform containing the peak of the array of the observed objects including the error position, the direction is corrected in order to maintain the peak of the array of the observed objects including the error position maximum.

A fourth aspect is a semiconductor device evaluation apparatus for evaluating observed objects including an error position arranged on a semiconductor substrate, including: a transport unit for moving the semiconductor substrate; a first detection unit for detecting electric information of the observed objects including the error position arranged on the semiconductor substrate; a first calculating unit calculating integrals based on the electric information in at least first and second directions among directions in which arrays of the observed objects are arranged, detecting a first waveform obtained by calculating the integral in the first direction and detecting a second waveform obtained by calculating the integral in the second direction, wherein the first waveform includes a first peak which contains the array of the observed objects including the error position and is larger than at least one of the other peaks, and wherein the second integral-waveform has peaks of substantially the same height; and a first control unit controlling the first transport unit to move the semiconductor substrate in a direction for maintaining the peak of the first waveform that contains the array of the observed objects including the error position based on a calculation result of the first calculating unit, wherein the first calculation unit counts the peaks of the second waveform while moving the semiconductor substrate by the first transport unit, and regarding both vertical and lateral directions of the semiconductor substrate, calculates the total number of peaks detected while the semiconductor substrate is moved by the first transport unit from the error position to a predetermined reference position.

A fifth aspect is the above-described semiconductor device evaluation apparatus, further including: a focused ion beam generation unit; a second transport unit for moving the semiconductor substrate; a second detection unit for detecting a reference position on the semiconductor substrate and detecting electric information of the observed objects including the error position arranged on the semiconductor substrate; a second calculating unit calculating integrals based on the electric information in at least third and fourth directions among directions in which arrays of the observed objects are arranged, detecting a third waveform obtained by calculating the integral in the third direction and detecting a fourth waveform obtained by calculating the integral in the fourth direction, wherein the third waveform includes a peak which contains the array of the observed objects including the error position and is larger than at least one of the other peaks, and wherein the fourth waveform has peaks of substantially the same height; and a second control unit controlling the second transport unit to move the semiconductor substrate from the reference position in a direction for maintaining the peak of the third waveform that contains the array of the observed objects including the error position based on a calculation result of the second calculation unit, wherein when the second control unit controls the second transport unit to move the semiconductor substrate in a vertical direction and a lateral direction of the semiconductor substrate, the second calculation unit counts the peaks of the waveform in the vertical direction caused by moving the semiconductor substrate in the lateral direction and counts the peaks of the waveform in the vertical direction caused by moving the semiconductor substrate in the lateral direction; the second control unit controls the second transport unit to move the semiconductor substrate until a number of the peaks in the vertical direction counted by the second calculation unit reaches the total number of the peaks in the vertical direction counted by the first calculation unit, and until a number of the peaks in the lateral direction counted by the second calculation unit reaches the total number of the peaks in the lateral direction counted by the first calculation unit; and the focused ion beam generation unit processes the semiconductor substrate with a focused ion beam after moving the semiconductor substrate by the second control unit.

A sixth aspect is the above-described semiconductor device evaluation apparatus, wherein the second control unit, when the semiconductor substrate is moved in a direction for maintaining the peak of the first waveform that includes the error position, corrects the direction in order to maintain the peak of the array including the error position maximum.

A constitution in accordance with the above-described aspects includes steps of: detecting electric information of observed objects including an error position arranged on a semiconductor substrate; calculating integrals based on the electric information detected above in at least first and second directions among directions in which arrays of the observed objects are arranged; detecting a first integral-waveform obtained by calculating the integral in the first direction and detecting a second waveform obtained by calculating the integral in the second direction, wherein the first waveform includes a first peak which contains the array of the observed objects including the error position and is larger than at least one of other peaks, and wherein the second integral-waveform has a second peak of substantially the same height as the first peak; moving the semiconductor substrate in a direction for maintaining the peak of the first/second waveform that includes an array of the observed objects including the error position; counting the peaks of the second/first waveforms caused by moving the semiconductor substrate; and calculating the total number of peaks detected while the semiconductor substrate is moved from the error position to a predetermined reference position. Therefore, it is possible to accurately detect the position of an error on the semiconductor substrate from a reference position.

In addition, another constitution in accordance with the above-described aspects that provides a focused ion beam generation unit includes steps of: detecting a reference position on the semiconductor substrate; detecting electric information of the observed objects including the error position arranged on the semiconductor substrate; calculating integrals based on the detected electric information in at least third and fourth directions among directions in which arrays of the observed objects are arranged, detecting a third integral-waveform obtained by calculating the integral in the third direction and detecting a fourth waveform obtained by calculating the integral in the fourth direction, wherein the third waveform includes a third peak which contains an array of the observed objects including the error position and which is larger than at least one of the other peaks, and wherein the fourth integral-waveform has a fourth peak of substantially the same height as the third peak; counting the peaks of the third waveform caused by moving the semiconductor substrate from the reference position in a direction for maintaining the peak of an array of the fourth waveform including the error position, and counting peaks of the fourth waveform caused by moving the semiconductor substrate from the reference position while maintaining the peak of an array of the third waveform including the error position; moving the semiconductor substrate until the total number of peaks in the third direction reaches the total number of peaks in the first direction and until the total number of peaks in the fourth direction reaches the total number of peaks in the second direction; and processing the semiconductor substrate after a moving operation by radiating a focused ion beam. Therefore, when a process on the semiconductor substrate by the focused ion beam is conducted based on the position information from the error position on the semiconductor substrate to the reference position obtained beforehand, it is possible to move the semiconductor substrate from the reference position to the error position, and it is possible to provide a substrate for observing a cross section.

In addition, another constitution in accordance with the above-described aspects includes a step of, correcting the direction in order to maintain the peak of an array including the error position maximum while moving the semiconductor substrate in a direction for maintaining the peak of the first/second or third/fourth waveform that includes the error position.

Therefore, even when there is a gap between the moving direction of the semiconductor substrate and the direction of an array of the observed objects including the error position, it is possible to correct the moving direction to the direction of the observed objects including the error position.

DETAILED DESCRIPTION OF THE INVENTION

Hereinafter, in reference to the drawings, one embodiment of the present invention, as an example, is explained.

Figure 1:
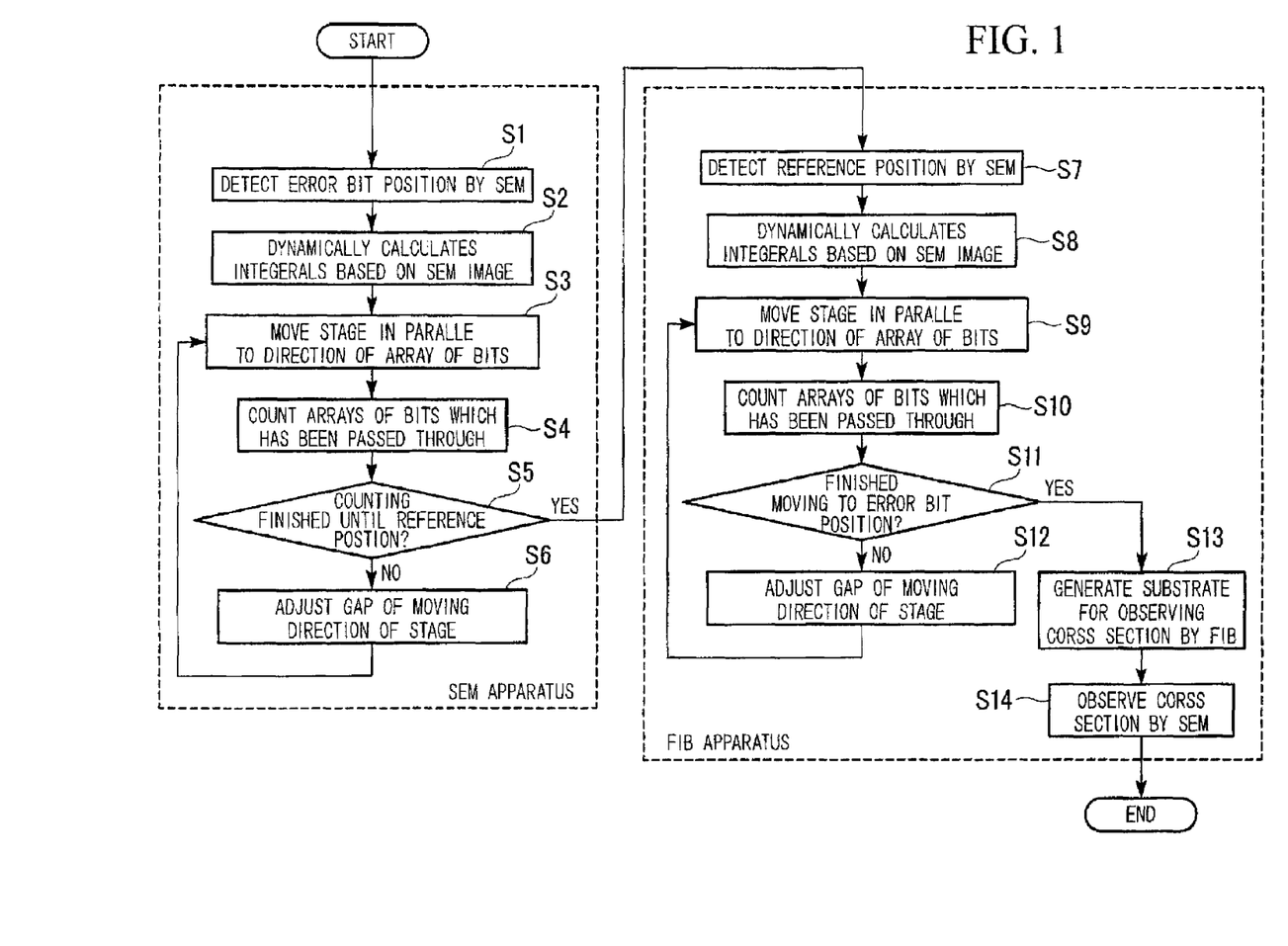
FIG. 1 is a flowchart which shows an error position detection method and a preparation method of a substrate for observing the cross section of a semiconductor device of one embodiment.

FIG. 1 is a flowchart for explaining an evaluation method of a semiconductor device in the embodiment. In FIG. 1, Steps S1-S6 show a flowchart of an error position detection method by using a SEM apparatus (Scanning Electron Microscope), and Steps S7-S14 show the flowchart of a preparation method of a substrate for observing a cross section by using a FIB (Focused Ion Beam) apparatus.

In this embodiment, in order to detect the position of an error bit, the above-described methods are applied to memory devices such as a DRAM (Dynamic Random Access Memory) on which bit units are regularly arranged.

Figure 2:
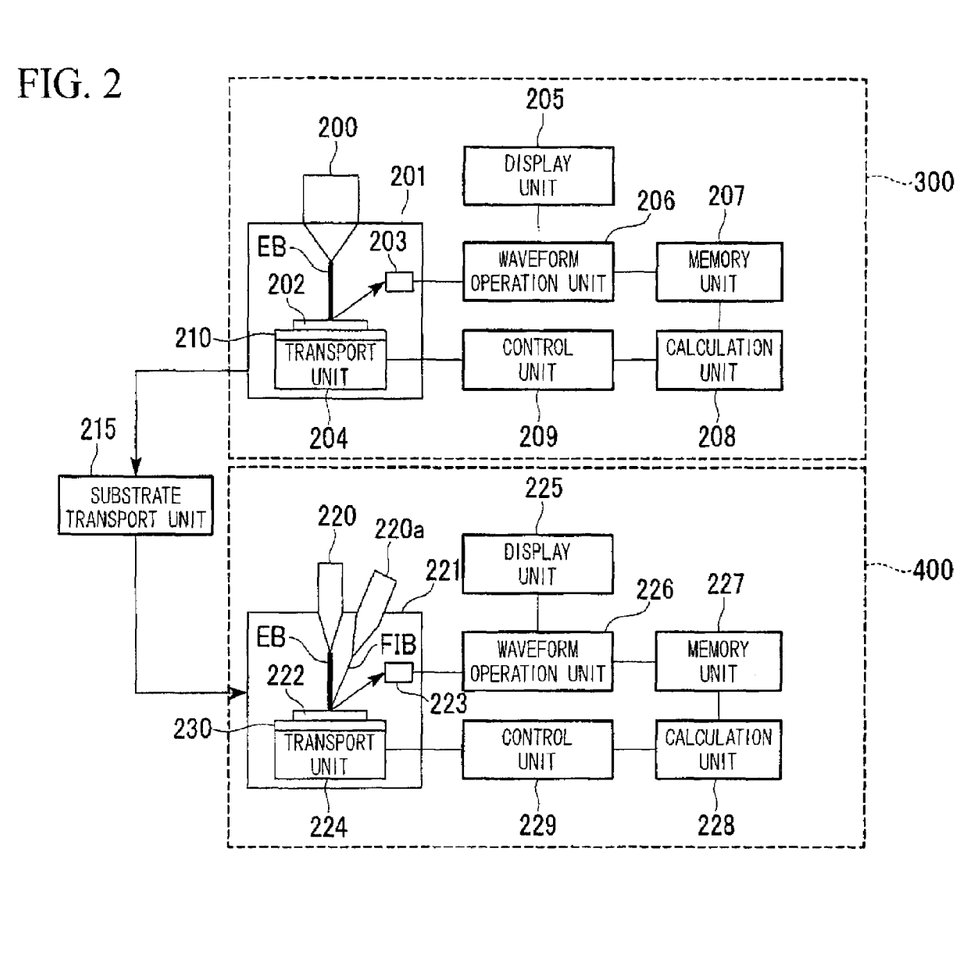
FIG. 2 is a drawing showing a constitution of a semiconductor device evaluation apparatus which is used for conducting operations of both the error position detection method and the preparation method of the substrate for observing the cross section of the semiconductor device of the embodiment.

FIG. 2 is a drawing showing a constitution of a semiconductor device evaluation apparatus which is used for conducting an operation of the semiconductor device evaluation method of this embodiment As shown in FIG. 2, the semiconductor device evaluation apparatus includes and is constituted from a SEM apparatus 300, a FIB apparatus 400 and a substrate transport unit 215. It should be noted that the FIB apparatus 400 includes a SEM function other than the SEM apparatus 300.

The substrate transport unit 215 transports a substrate between the SEM apparatus 300 and the FIB apparatus 400.

The SEM apparatus 300 includes and is constituted from an electron beam generation unit 200, a vacuumed chamber 201, a substrate 202, a detection unit 203, a transport unit 204, a display unit 205, a waveform operation unit 206, a memory unit 207, a calculation unit 208, a control unit 209 and a stage 210. It should be noted that other constitutional elements of the SEM apparatus 300 are the same as generally used SEM apparatuses, and are omitted in the drawings.

The electron beam generation unit 200 generates an electron beam (EB) and radiates the beam on the substrate 202. The detection unit 203 detects secondary electrons generated on a surface of the substrate and converts the secondary electrons to an electric signal. The vacuumed chamber 201 contains the substrate 202, detection unit 203, transport unit 204 and the stage 210.

The transport unit 204 transports the substrate 202 mounted on the stage 210 based on commands from the control unit 209. The waveform operation portion 206 conducts a waveform operation on the electric signal obtained by the detection unit 203. The display unit 205 displays a SEM image of a signal obtained by conducting the wave form operation of the waveform operation portion 206. The memory unit 207 stores data of the SEM image. The calculation unit 208 calculates an integral based on the data of the SEM image stored in the memory unit 207, and counts the number of peaks of the waveform obtained by calculating the integral. The control unit 209 controls the transport unit 204 based on calculation results of the calculation unit 208.

The FIB apparatus 400 includes and is constituted from an EB generation unit 220, a FIB generation unit 220a, a vacuumed chamber 221, a substrate 222, a detection unit 223, a transport unit 224, a display unit 225, a waveform operation unit 226, a memory unit 227, a calculation unit 228, a control unit 229 and a stage 230. It should be noted that other constitutional elements of the FIB apparatus 400 are the same as generally used FIB apparatuses, and are omitted in the drawings.

The EB generation unit 220 generates EB and radiates the beam on the substrate 222. The detection unit 223 detects secondary electrons generated on a surface of the substrate and converts the secondary electrons to an electric signal. The FIB generation unit 220a generates FIB (Focused Ion Beam) in order to process a specific portion of the substrate 222 based on the SEM image which is obtained via the EB generation unit 220, the detection unit 223 and the waveform operation unit 226. Other constitutional elements of the FIB apparatus 400 have the same functions as the SEM apparatus 300, and explanations are omitted. Regarding the display unit 225, the waveform operation unit 226, the memory unit 227, the calculation unit 228 and the control unit 229, it is possible to share the constitutional elements of the SEM apparatus 300 by applying the display unit 205, the waveform operation unit 206, the memory unit 207, the calculation unit 208 and the control unit 209

(Error Position Detection Method of Semiconductor Device)

Next, the flowchart of FIG. 1 is explained with reference to FIG. 2.

First, the EB generation apparatus 200 of the SEM apparatus 300 shown in FIG. 2 radiates EB on the substrate 202, and secondary electrons generated on a surface of the substrate are detected by the scanning electron microscope of the detection unit 203 and are converted to an electric signal. The electric signal is converted to both a waveform of the signal corresponding to the strength of the secondary electrons and a SEM image (observation image) and is displayed by the display unit 205. Based on both the waveform of the signal and the SEM image, the position of an error bit is detected (Step S1).

The memory unit 207 stores the SEM image converted by the waveform operation unit 206. Based on the SEM image stored by the memory unit 207, the calculation unit 208 calculates integrals of the waveform of the signal along two directions in order to obtain a two-dimensional-integral-waveform (Step S2).

Figures 3A, 3B, 3C:
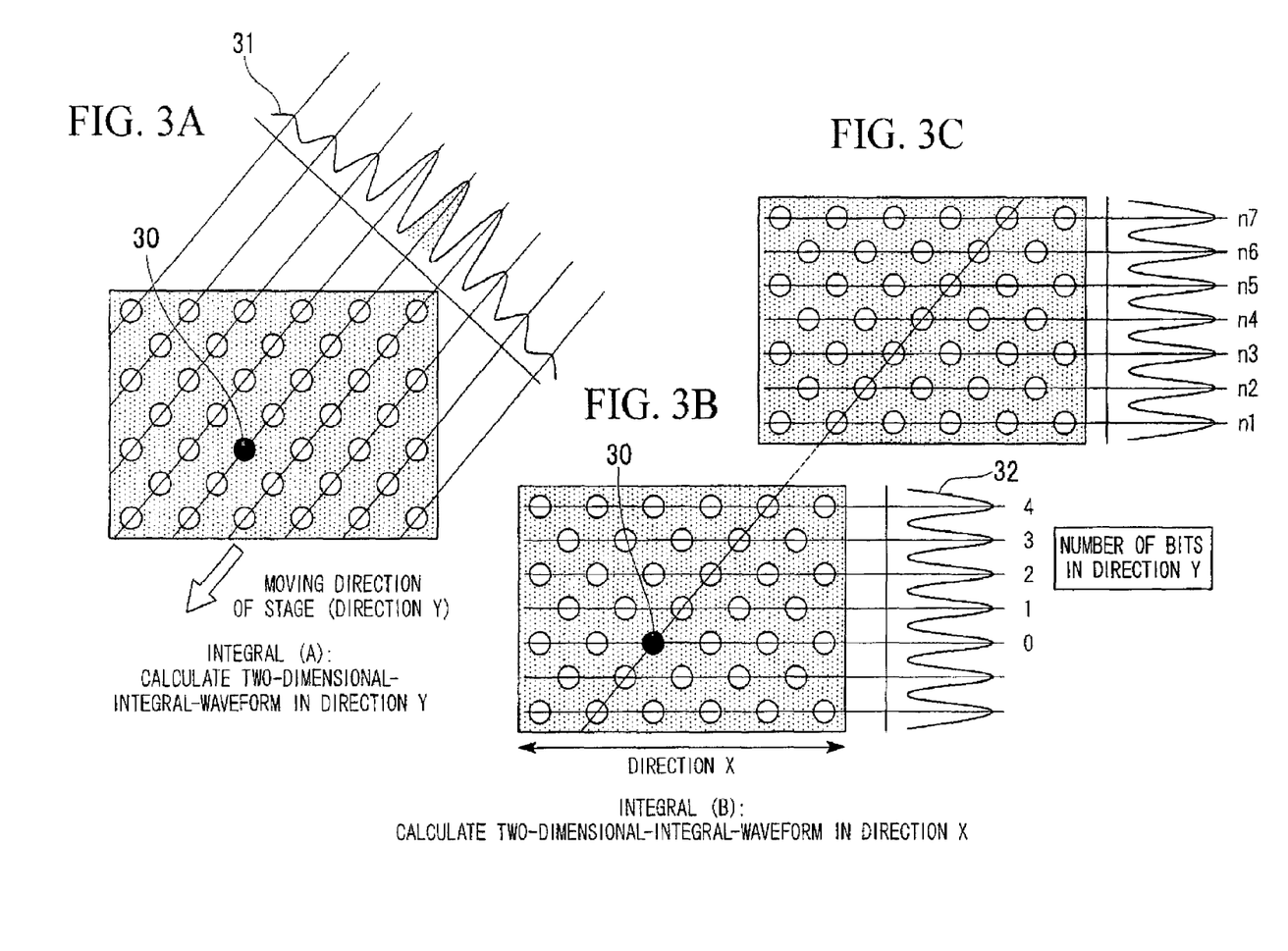
FIG. 3A is a drawing for explaining integral calculations along two directions in the embodiment.
FIG. 3B is a drawing for explaining integral calculations along two directions in the embodiment.
FIG. 3C is a drawing for explaining integral calculations along two directions in the embodiment.

Such an integral along two directions are both an integral A (FIG. 3A) for calculating a moving direction of the stage 210 and an integral B (FIGS. 3B and 3C) for calculating the number of bits from an error bit position 30 to a reference position, that is, an end portion of arranged pattern of the observed object. As shown in FIG. 3A-C, it is possible to obtain a two-dimensional-integral-waveform 31 by calculating the integral A, and it is possible to obtain a two-dimensional-integral-waveform 32 by calculating the integral B. A direction along which the integral A is calculated is a direction which has the maximum value if a peak of the integral A is calculated. The calculation unit 208 simultaneously calculates the integrals along two directions in parallel based on the electric signal of the SEM image stored in the memory unit 207.

FIGS. 3A and 3B show the SEM image in the case of detecting an error bit position 30. FIG. 3A (integral A) shows a two-dimensional-integral-waveform 31 obtained by calculating an integral of the electric signal waveform along a direction Y (direction along which the stage moves) based on the SEM image. If the integral is calculated along the direction Y, a small peak is obtained by calculating the two-dimensional-integral-waveform because the number of bits on the substrate is smaller at both edges than a center portion along the direction Y. Therefore, the error bit position 30 is set to a position close to the center of the SEM image in order to obtain a large peak of the two-dimensional-integral-waveform.

On the other hand, FIGS. 3B and 3C (integral B) show a two-dimensional-integral-waveform 32 obtained by calculating an integral of the electric signal waveform along a direction X based on the SEM image. If the integral is calculated along the direction X, all the peaks of the two-dimensional-integral-waveform are substantially the same regardless of the positions because the number of bits on the substrate is equally spread along the direction X. This is an initial state, and in a two-dimensional-integral-waveform obtained by calculating the integral B, a peak corresponding to the error bit position 30 is defined as a count of 0. After this, the stage is moved in the direction Y (direction of an arrow shown in FIG. 3A), the two-dimensional-integral-waveform 32 calculated by the integral B continuously moves downward, and bits above the error bit position 30 pass through the error bit position 30. In this operation, it is possible to count the number of bits which have moved in the direction Y by counting the number of peaks of the two-dimensional-integral-waveform which pass the error bit position. In FIGS. 3B and C, FIG. 3B shows four peaks which are going to be counted, and FIG. 3C shows the case in which bits on lines from n1 to n7 are counted if the substrate is moved further after FIG. 3B.

In accordance with such operations, by counting the number of bits from the error bit position 30 to the reference position that have moved along vertical and lateral directions with regard to lines on which the bits are arranged, it is possible to detect a position of the error bit position 30.

Figure 4:
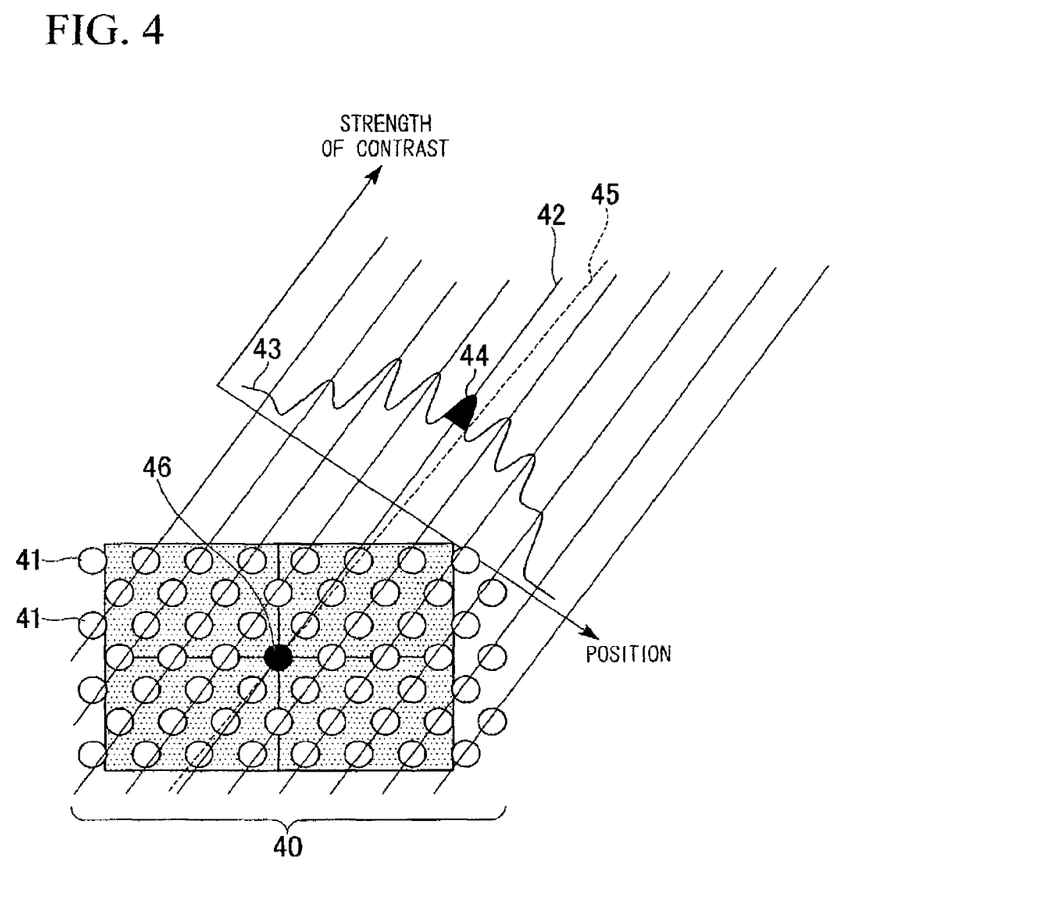
FIG. 4 is a drawing for explaining the peak strength in the embodiment.

Here, an operation for correcting a gap or the difference of moving direction in the integral (A) shown in FIG. 3A is explained. A SEM image 400 is obtained by detecting positions of bits that are detected by using the SEM apparatus 300 which can detect errors as electrical characteristics contrast or potential difference contrast. The calculation unit 208 calculates an integral along the integral direction 42, and as shown in FIG. 4, a two-dimensional-integral-waveform 43 is obtained which corresponds to brightness/darkness (strength) of contrast of the SEM image 40. If the integral direction 42 has a gap or difference from a center line along a direction on which the bits are arranged, strength of contrast obtained by calculating the integral is fluctuated. Therefore, in such a case, a peak 44 of the two-dimensional-integral-waveform 43 is fluctuated. Therefore, when a peak 44 is detected which indicates the highest value while adjusting the integral direction 42, it is possible to set the integral direction 42 to the same direction as the center line 45 which is in a direction on which the bits 41 are arranged. As shown in FIG. 4, if there is a gap or difference between the integral direction 42 and a direction 45 along which the bits 41 are arranged, the strength of contrast of the peak 44 including the error bit position 46 is decreased. The calculation unit 208 controls the transport unit 204 via the control unit 209 based on the amount of decrease, and by correcting or adjusting gaps or differences of the integral direction 42 so as to make the peak 44 highest, it is possible to transport the substrate in the most appropriate direction that is the same direction as the center line 45 along which the bits 41 are arranged.

Next, explanation of the flowchart of FIG. 1 is continued. While the control unit 209 controls and moves the stage 210 on which the substrate 202 is mounted so as to move in a parallel direction with a direction of the integral A shown in FIG. 3A (obtained by the calculation unit 208) by controlling the transport unit 204 (Step S3), the calculation unit 208 counts the number of bits from a position of the peak obtained by the integral B (Step S4).

After this, the calculation unit 208 detects that the calculation unit 208 has finished counting until reaching the reference position of the substrate 202 (Step S5). In such a determination, it is possible to determine based on a fact that the waveform obtained by calculating an integral is not continuous at the position of an end at which the bits are not arranged. When the calculation unit 208 detects the end of counting, the calculation unit 208 set the counted value to the memory unit 207 and goes to Step S7 (Step S5; YES). If the calculation unit 208 does not detect the end of counting, the calculation unit 208 goes to Step S6 (Step S5; NO).

Next, when the calculation unit 208 does not detect the end of counting, based on the two-dimensional-integral-waveform of the integral A calculated by the calculation unit 208, the control unit 209 refers to the height of a peak of the waveform and conducts a feedback control of the transport unit 204 of the stage 210 in order to correct or adjust a gap from an array of bits (Step S6). After this, the operations of Steps S3-S6 are repeated unless counting has been completed, that is, counting until the reference position at Step S5, and based on a two-dimensional-integral-waveform of the integral B, while maintaining accuracy of moving the stage 210, the calculation unit 208 counts the number of bits from the error bit passed by moving the stage 210.

Figure 5:
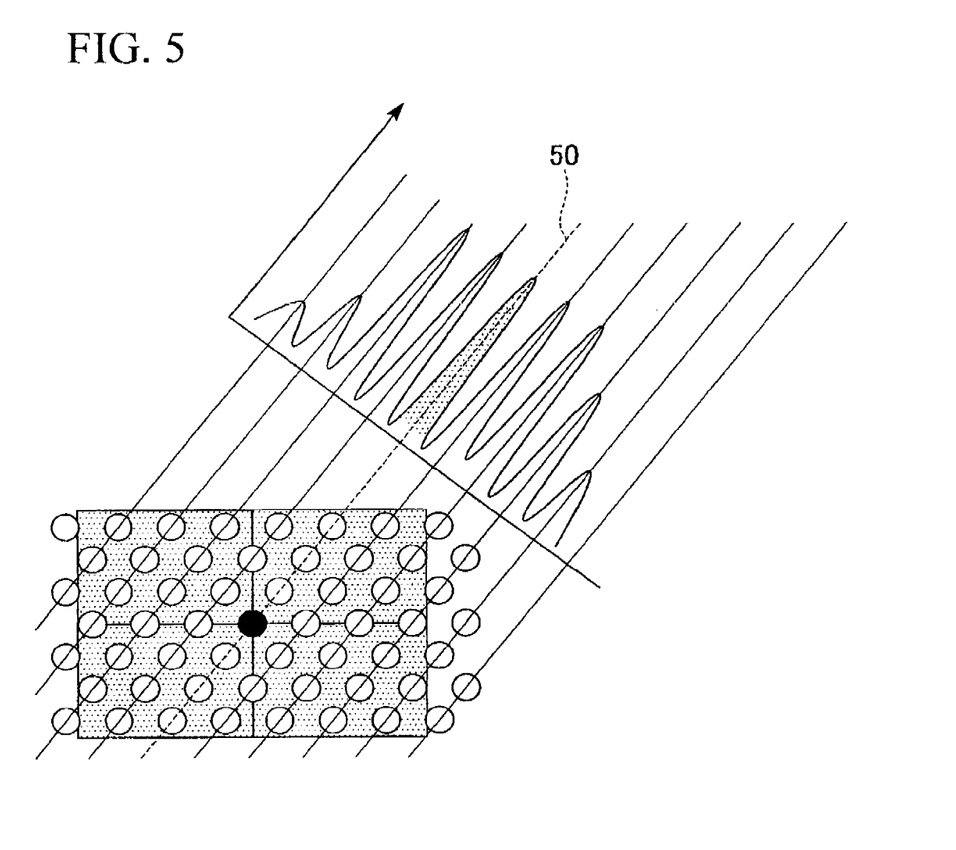
FIG. 5 is a drawing for explaining a motion of a stage in the embodiment.

Here, a moving operation of the stage 210 is further explained. As shown in FIG. 5, it is possible to transport the substrate 202 in parallel with an array of bits by moving the stage on which the substrate 202 is mounted along an integral direction 50. In such a case, it is possible to maintain the strength of a peak of contrast including the error bit position if the stage 210 is moving in parallel with the array of bits.

However, in the case of moving the stage 210 based on the coordinates of the stage, there is a possibility of causing a gap between a direction of moving the stage 210 and the array of bits. In such a case, a peak of the two-dimensional-integral-waveform is moved or disappears. Therefore, it is possible to move the stage 210 in parallel with the array of bits by conducting a feedback control of the transport unit 210 so as to detect and maintain the peak.

Figure 6:
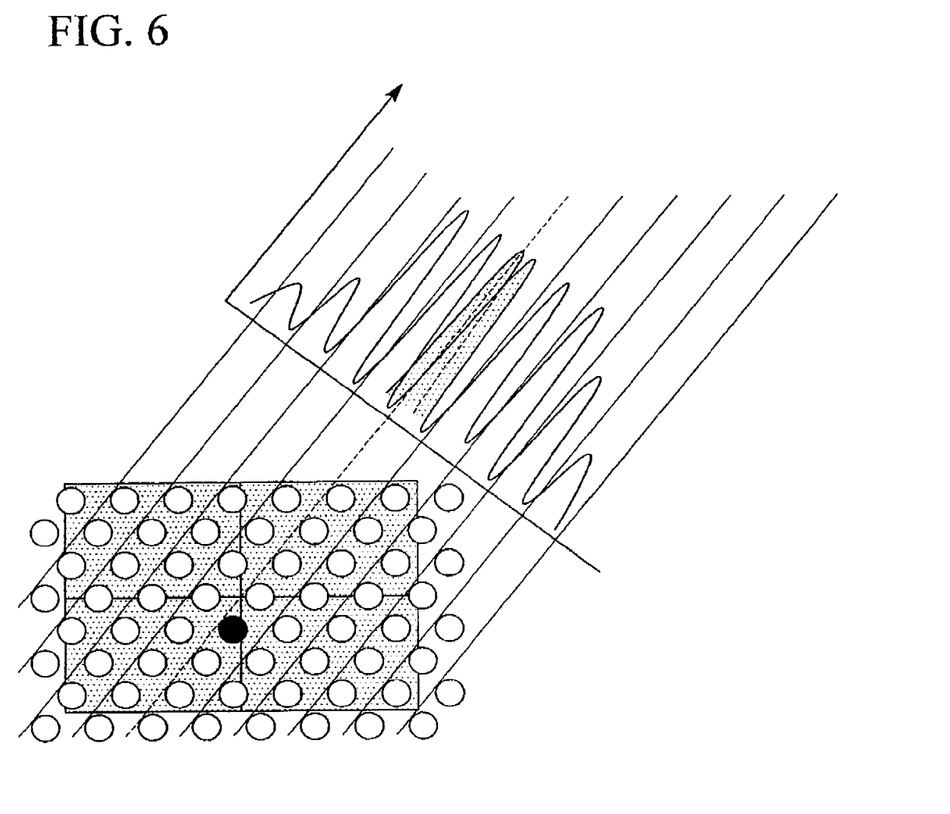
FIG. 6 is a drawing for explaining gaps between directions of motion of a stage in the embodiment.

In other words, as shown in FIG. 6, the peak including the error bit position is moved if there is a gap between the array of bits and a direction in which the stage 210 is moved. Therefore, the control unit 209 controls the stage 210 to move so as to counteract the amount of movement if the peak is moved. That is, by maintaining the S/N (signal to noise) ratio of the peak of the two-dimensional-integral-waveform at a high level, the control unit 209 conducts a feedback control of the transport unit 204 of the stage 210 so as to avoid a gap of the peak position including the error bit position.

It should be noted that a gap of the peak position is corrected or adjusted after moving the stage 210 for a predetermined small distance (in a range shorter than a half of an interval between two bits).

Figure 7:
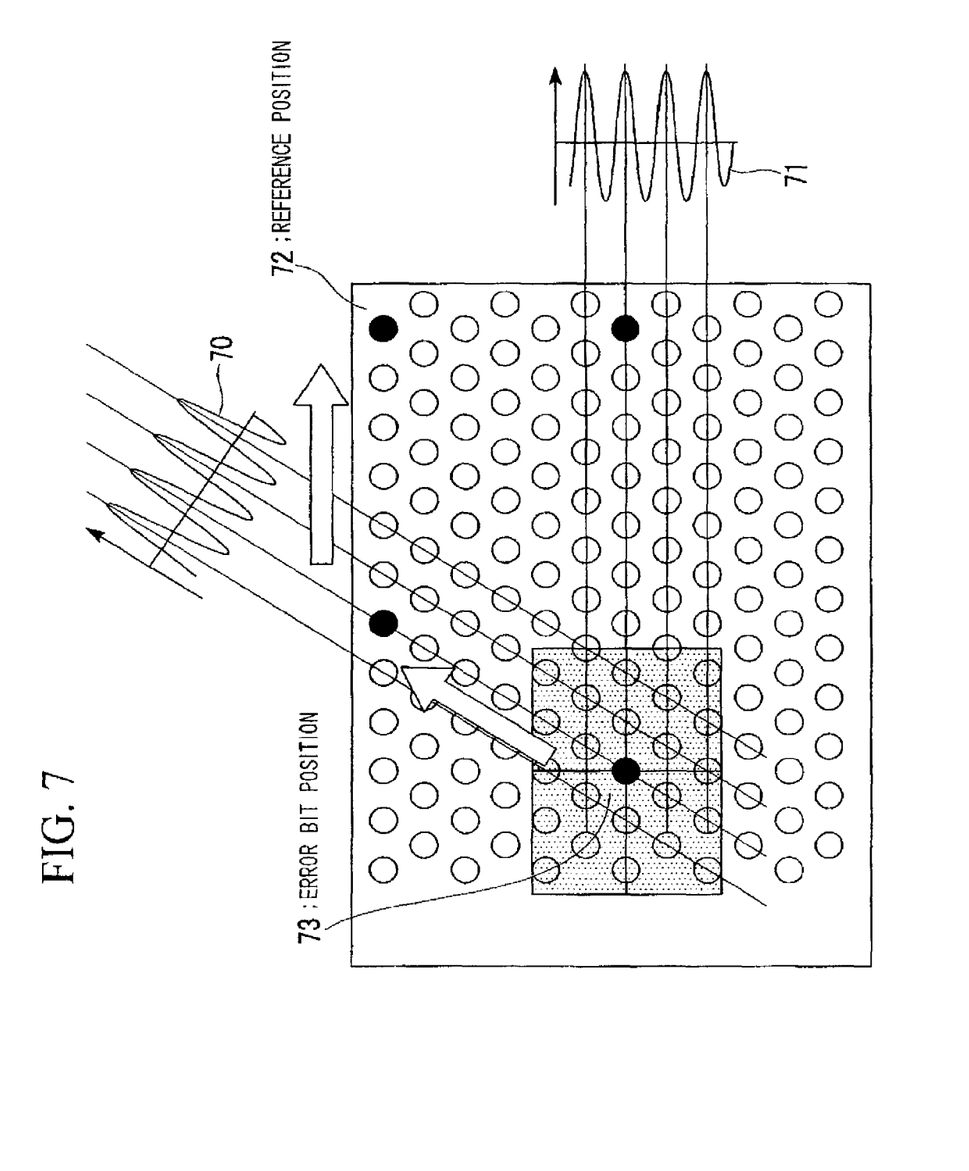
FIG. 7 is a drawing for explaining the count of a number of bits in the embodiment.

Next, an operation of counting bits described above is explained. As shown in FIG. 7, in addition to a two-dimensional-integral-waveform 70 by calculating the integral A, the calculation unit 208 continuously obtains a two-dimensional-integral-waveform 71 by calculating the integral B and counts peaks of the waveform 71 that move in accordance with motion of the stage 210. The number of peaks of the waveform 71 corresponds to the number of bits which have passed while moving the substrate in a moving direction. Therefore, it is possible to obtain an accurate number of bits from the error bit position by counting the number of bits which have passed while moving the substrate. Then, the calculation unit 208 calculates the two-dimensional-integral-waveforms of the SEM image in vertical and lateral directions with regard to the array of bits, and counts the number of bits in the vertical and lateral directions until reaching the reference position 72. Therefore it is possible to obtain the number of bits from the error bit position 73 to the reference position 72. Therefore, it is possible to accurately detect the error bit position 73.

It should be noted that the number of peaks is accurately counted because the position of the stage 210 is corrected or adjusted while counting.

In addition to the above-described method, if an electron accelerating voltage (10 kV or larger) is applied, it is possible to apply the positional relationship of a pattern of the foundation layer. That is, if the electron beam is changed to the electron accelerating voltage when the substrate is moved while counting the bits and reaches the reference position which is an end of the mat, there are cases in which it is possible to see the pattern of the foundation layer. Therefore, if the positional relationship of the pattern of the foundation layer is stored in the memory unit 207 beforehand, it is possible to accurately detect the error bit position in reference to the positional relationship upon processing by using, for example, FIB.

(Preparation Method of Substrate for Observing a Cross Section of Semiconductor Device)

Next, an operation of the FIB apparatus is explained below.

When the SEM apparatus 300 finishes counting bits from the error bit position to the reference position (Step S5; YES), the substrate 202, that is the substrate 222, is transported to the FIB apparatus 400 by the substrate transport unit 215. A calculation operation of the error bit position is conducted in order to prepare the substrate for observing the cross section.

First, the SEM function (the EB generation unit 220, the detection unit 223, the display unit 225, the waveform operation unit 226, the memory unit 227, the calculation unit 228, the control unit 229, the transport unit 224 and the stage 230) which is set inside the FIB apparatus 400 shown in FIG. 2 detects a reference position of the FIB apparatus 400, that is, a position of a bit at an end of the mat used as the reference position of the SEM apparatus 300. In the same manner as an operation of the SEM apparatus 300, the SEM image, which is converted from the electric signal by the waveform operation unit 226 based on the secondary electrons detected by the detection unit 223, is stored in the memory unit 207. The SEM image is stored in the memory unit 227. The calculation unit 228 calculates integrals in two directions based on the SEM image stored in the memory unit 227 in order to obtain two-dimensional-integral-waveforms.

While the control unit 229 controls the transport unit 224 in order to move the stage 230 in a parallel direction with arrays of bits (Step S9), the calculation unit 228 counts peak positions obtained by calculating integrals (Step S10).

After this, the calculation unit 228 determines whether or not the count of peaks (that is, a value obtained by counting until reaching the error bit position of the substrate) has reached the value counted at Steps S4 and S5 (Step S11). If the calculation unit 228 detects that the count of peaks has not reached the value counted at Steps S4 and S5, the calculation unit 228 conducts Step S12 (Step S11; NO). If the calculation unit 228 detects that the count of peaks reaches the value counted at Steps S4 and S5, the calculation unit 228 conducts an operation of Step S13 (Step S11; YES).

Next, when the calculation unit 228 detects that the count of peaks has not reached the value counted at Steps S4 and S5, based on the two-dimensional-integral-waveform of the integral calculated by the calculation unit 228, the control unit 229 refers to a height of a peak of the waveform and conducts a feedback control of the transport unit 224 of the stage 230 in order to correct or adjust a gap from an array of bits (Step S12). After this, operations of Steps S9-S12 are repeated unless the end of counting, that is, counting until the counted value obtained at Steps S4 and S5, and while maintaining accuracy of moving the stage 230, the calculation unit 228 counts the number of bits that have been moved from the reference position.

The above-described operation from Step S9 to S12 is conducted along both the vertical (for example, direction Y of FIG. 3B) and lateral (for example, direction X of FIG. 3B) directions with regard to lines on which the bits are arranged. When the counted values of both directions obtained in Steps S9-S12 reach the counted values obtained at Steps S4 and S5 with regard to vertical and lateral directions, that is, when the counted values obtained in Steps S9-S12 reach the total number of peaks, the counted values obtained in Steps S9-S12 reach the error bit position detected by the SEM apparatus 300. A radiation area of FIB of the FIB generation unit 220a is set to be the same as a radiation area of EB of the EB generation unit 220 beforehand. Therefore, after detecting the error bit position inside the SEM image which has been obtained by the EB generation unit 220, the detection unit 223 and the waveform operation unit 226, it is possible to obtain the substrate for observing the cross section by radiating FIB on the substrate 222 and processing the error bit position (Step S13). It is possible to observe the cross section by using the substrate for observing the cross section (Step S14).

It should be noted that, in a constitution of the above-described embodiment, the reference positions on the substrates 202 and 222, that is, end portions of the arranged patterns of the observed objects formed on the substrates can be detected by using a function which is generally provided by the SEM apparatus 300 or the FIB apparatus 400.

While preferred embodiments of the present invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

For example, it is possible to detect error positions such as a via hole and a contact hole by applying the present invention. On the other hand, it is possible to detect an error position of a semiconductor device other than a memory device by applying the present invention. In addition to the above, it is possible to move the substrate by an operator who controls the transport units 204 and 224 and the substrate transport unit 215.

It should be noted that the above-described first transport unit corresponds to the transport unit 204, the first detection unit corresponds to the detection unit 203, the first calculation unit corresponds to the calculation unit 208, and the first control unit corresponds to the control unit 209. Furthermore, it should be noted that the above-described second transport unit corresponds to the transport unit 224, the second detection unit corresponds to the detection unit 223, the second calculation unit corresponds to the calculation unit 228, the second control unit corresponds to the control unit 229, and the focused beam generation unit corresponds to the FIB generation unit 220a.

What is claimed is:

1. A semiconductor device evaluation method of a semiconductor device evaluation apparatus for evaluating observed objects including an error position arranged on a semiconductor substrate, comprising:

a first step of detecting electric information of the observed object including the error;

a second step of calculating integrals based on the electric information in at least first and second directions among directions in which arrays of the observed objects are arranged, detecting a first integral-waveform obtained by calculating the integral in the first direction and detecting a second waveform obtained by calculating the integral in the second direction, wherein the first waveform includes a first peak which contains the array of the observed objects including the error position and is larger than at least one of other peaks, and wherein the second integral-waveform has peaks of substantially the same height;

a third step of counting peaks of the second waveform caused while moving the semiconductor substrate in a direction for maintaining the peak of the first waveform that contains an array of the observed objects including the error position; and a fourth step of calculating a total number of the peaks regarding both vertical and lateral directions of the semiconductor substrate while the semiconductor substrate is moved from the error position to a predetermined reference position in the third step.

2. A semiconductor device evaluation method according to claim 1, further comprising:

a fifth step of detecting the reference position on the semiconductor substrate;

a sixth step of detecting electric information of the observed objects including the error position arranged on the semiconductor substrate;

a seventh step of calculating integrals based on the electric information detected in the sixth step in at least third and fourth directions among directions in which arrays of the observed objects are arranged, detecting a third integral-waveform obtained by calculating the integral in the third direction and detecting a fourth waveform obtained by calculating the integral in the fourth direction, wherein the third waveform includes a third peak which contains an array of the observed objects including the error position and which is larger than at least one of other peaks, and wherein the fourth integral-waveform has peaks of substantially the same height;

an eighth step of counting peaks of the fourth waveform while moving the semiconductor substrate from the reference position in a direction for maintaining the peak of the third waveform containing an array of the observed objects including the error position;

a ninth step of conducting a counting operation of the eighth step in both the vertical and lateral directions of the semiconductor substrate, moving the semiconductor substrate until a total number of peaks in the vertical direction detected in the eighth step reaches a total number of peaks in the vertical direction obtained in the fourth step and a total number of peaks in the lateral direction detected in the eighth step reaches a total number of peaks in the lateral direction obtained in the fourth step; and a tenth step of processing the semiconductor substrate after a moving operation of the ninth step by radiating a focused ion beam.

3. A semiconductor device evaluation method according to claim 2 wherein, in the step 3, when the semiconductor substrate is moved in a direction for maintaining the peak of the second waveform containing the peak of the array of the observed objects including the error position, the direction is corrected in order to maintain the peak of the array of the observed objects including the error position maximum.

4. A semiconductor device evaluation apparatus for evaluating observed objects including an error position arranged on a semiconductor substrate, comprising:

a transport unit for moving the semiconductor substrate;

a first detection unit for detecting electric information of the observed objects including the error position arranged on the semiconductor substrate;

a first calculating unit calculating integrals based on the electric information in at least first and second directions among directions in which arrays of the observed objects are arranged, detecting a first waveform obtained by calculating the integral in the first direction and detecting a second waveform obtained by calculating the integral in the second direction, wherein the first waveform includes a first peak which contains the array of the observed objects including the error position and is larger than at least one of other peaks, and wherein the second integral-waveform has peaks of substantially the same height; and a first control unit controlling the first transport unit to move the semiconductor substrate in a direction for maintaining the peak of the first waveform that contains the array of the observed objects including the error position based on a calculation result of the first calculating unit, wherein the first calculation unit counts peaks of the second waveform while moving the semiconductor substrate by the first transport unit, and regarding both vertical and lateral directions of the semiconductor substrate, calculates a total number of peaks detected while the semiconductor substrate is moved by the first transport unit from the error position to a predetermined reference position.

5. A semiconductor device evaluation apparatus according to claim 4, further comprising:

a focused ion beam generation unit;

a second transport unit for moving the semiconductor substrate;

a second detection unit for detecting a reference position on the semiconductor substrate and detecting electric information of the observed objects including the error position arranged on the semiconductor substrate;

a second calculating unit calculating integrals based on the electric information in at least third and fourth directions among directions in which arrays of the observed objects are arranged, detecting a third waveform obtained by calculating the integral in the third direction and detecting a fourth waveform obtained by calculating the integral in the fourth direction, wherein the third waveform includes a peak which contains the array of the observed objects including the error position and is larger than at least one of other peaks, and wherein the fourth waveform has peaks of substantially the same height; and a second control unit controlling the second transport unit to move the semiconductor substrate from the reference position in a direction for maintaining the peak of the third waveform that contains the array of the observed objects including the error position based on a calculation result of the second calculation unit, wherein when the second control unit controls the second transport unit to move the semiconductor substrate in a vertical direction and a lateral direction of the semiconductor substrate, the second calculation unit counts peaks of the waveform in the vertical direction caused by moving the semiconductor substrate in the lateral direction and counts peaks of the waveform in the vertical direction caused by moving the semiconductor substrate in the lateral direction;

the second control unit controls the second transport unit to move the semiconductor substrate until a number of the peaks in the vertical direction counted by the second calculation unit reaches a total number of the peaks in the vertical direction counted by the first calculation unit, and until a number of the peaks in the lateral direction counted by the second calculation unit reaches a total number of the peaks in the lateral direction counted by the first calculation unit; and the focused ion beam generation unit processes the semiconductor substrate with focused ion beam after moving the semiconductor substrate by the second control unit.

6. A semiconductor device evaluation apparatus according to claim 4, wherein the second control unit, when the semiconductor substrate is moved in a direction for maintaining the peak of the first waveform that includes the error position, corrects the direction in order to maintain the peak of the array including the error position maximum.

* * * * *